United States Patent [19]

Cook

[11] 4,340,883
[45] Jul. 20, 1982

[54] BIPOLAR MARK-SPACE ANALOGUE TO DIGITAL CONVERTER WITH BALANCED SCALE FACTORS

[75] Inventor: John G. Cook, Mytchett, England

[73] Assignee: The Solartron Electronic Group Limited, Farnborough, England

[21] Appl. No.: 915,488

[22] Filed: Jun. 14, 1978

[30] Foreign Application Priority Data

Jun. 20, 1977 [GB] United Kingdom .............. 25744/77
Jun. 20, 1977 [GB] United Kingdom .............. 25745/77

[51] Int. Cl.³ ...................... H03K 13/02; H03K 13/20
[52] U.S. Cl. ........................... 340/347 NT; 324/99 D; 340/347 M; 340/347 CC; 340/347 AD
[58] Field of Search .... 340/347 M, 347 NT, 347 AD, 340/347 CC; 324/99 D; 364/554, 460

[56] References Cited

U.S. PATENT DOCUMENTS

| | | | |
|---|---|---|---|
| 2,767,330 | 10/1956 | Marshall | 307/362 X |
| 2,851,638 | 9/1958 | Wittenberg et al. | 307/362 X |
| 3,445,839 | 5/1969 | Engelberg et al. | 340/347 M |
| 3,530,458 | 9/1970 | Willard et al. | 340/347 AD |
| 3,824,588 | 7/1974 | Vermillion | 340/347 AD X |
| 3,942,172 | 3/1976 | Tucker | 340/347 NT |
| 3,942,173 | 3/1976 | Wold | 340/347 AD X |
| 3,978,348 | 8/1976 | Henninger et al. | 340/347 NT X |
| 4,122,719 | 10/1978 | Carlson et al. | 73/342 |
| 4,136,396 | 1/1979 | Hansford | 364/554 |
| 4,139,889 | 2/1979 | Ingels | 364/460 |

OTHER PUBLICATIONS

Mitchell et al, Data Averager for Panel Meter Operates from Meter's Clock, Electronics, Apr. 26, 1973, p. 103.
Hatch, Microprocessor Multiplies a Digital Multimeter's Functions, Electronics, Sep. 16, 1976, pp. 97–101.
Faggin et al., Z-80 Chip Set Heralds Third Microprocessor Generation, Electronics, Aug. 19, 1976, pp. 89–93.

Primary Examiner—Thomas J. Sloyan
Attorney, Agent, or Firm—Dale Gaudier

[57] ABSTRACT

In a bipolar mark-space analogue-to-digital converter, two opposed-polarity reference voltages are applied to an integrator during a first conversion interval to balance a square-wave forcing-function signal and an input signal whose magnitude is to be measured, and a counter receives clock pulses at up and down inputs during application of the positive and negative reference voltages respectively. Subsequently, zero input signal is applied during a second conversion interval, and the inputs to the counter are interchanged, so that up- and down-counted pulses correspond to the negative and positive reference voltages respectively. At the end of the second conversion interval, the counter contains a digital representation of the input signal, corrected for zero drift. The application of the reference voltages is controlled by two level detectors which compare the integrator output with fixed detector levels, the magnitudes of which are chosen so that at zero input each reference voltage is applied for substantially half the period of the square-wave forcing-function signal. The operation of the converter may be coordinated by a microprocessor which is arranged to aggregate the counts of clock pulses accumulated by the counter during each cycle of the forcing-function signal.

4 Claims, 6 Drawing Figures

ANALOGUE-TO-DIGITAL CONVERTERS

This invention relates to analogue-to digital converters, and is particularly, though not exclusively, concerned with bipolar analogue-to-digital converters adapted to operate on the mark-space conversion principle.

Known types of analogue-to-digital converter comprise generating means for receiving an analogue input signal to be converted and generating a control signal having a period dependent upon the magnitude of the analogue input signal, means for defining a conversion interval, and a source of clock pulses, together with a counter for counting clock pulses for the duration of at least one control signal in a conversion interval. The number of clock pulses counted is indicative of the magnitude of the input signal.

One problem that is encountered with analogue-to-digital converters is zero drift. In conventional circuits, this is compensated by applying zero input signal to the converter for the duration of a conversion interval, and storing a charge on a capacitor in accordance with any zero error. The analogue input signal is then applied during a second conversion interval, and the stored zero-error charge applied in opposition to the input signal to cancel the zero error. This system has the disadvantage that there is always a delay after a measurement is initiated while the zero-error charge is being stored.

According to one aspect of this invention an analogue-to-digital converter comprises generating means for receiving an analogue input signal to be converted and generating a control signal having a period dependent upon the magnitude of the analogue input signal, means for defining a conversion interval, switch means for applying said analogue input signal to the generating means for the duration of one conversion interval and for applying zero input signal to the generating means for the duration of another conversion interval, a source of clock pulses, and counter means responsive to said control signal and to said defining means to count the clock pulses occurring during at least one control signal in said one conversion interval, and to count the clock pulses occurring during at least one control signal in said other conversion interval, whereby the combined counts constitute a digital representation of the magnitude of the integral of the analogue input signal over the one conversion interval, corrected for zero-drift.

This converter can be made more accurate than converters in which a zero-error charge is stored on a capacitor, and permits the zero-error determination to take place after the measurement of the analogue input signal, thereby avoiding the above-mentioned delay.

The counts may be combined in the counter means, for example by effecting them successively and in opposite directions in the counter means, so that the later count is algebraically subtracted from the earlier count.

In the case of a bipolar converter, the generating means may be arranged to generate at least one of first and second periodic control signals, having a period dependent upon the magnitude and sense of the analogue input signal, said counter means being arranged to count the clock pulses in a first direction during any first control signal and a second direction during any second control signal in the said one conversion interval, and to count the clock pulses in the second direction during any first control signal and the first direction during any second control signal in the said other conversion interval, whereby the count in the counter means at the end of both conversion intervals is the required digital representation.

Preferably the said one conversion interval occurs before the said other conversion interval.

The converter may be incorporated in a data logging system, for example, for sampling and recording successively the values of a number of parameters represented by respective analogue signals. In this case, a selector or scanner would be provided for selectively coupling different input signals to the converter, and is advantageously arranged to switch between input signals during said other conversion interval (while the switch means is applying zero input signal to the generating means).

This invention can be applied to various different types of converters, such as the so-called dual-slope analogue-to-digital converter (UK Patent Specification Nos. 869,262 and 1,090,047). It can be used to particular advantage in bipolar mark-space analogue-to-digital converters, such as that described in our UK Patent Specification No. 1,434,414, in which case an additional useful modification becomes possible.

In the form of bipolar mark-space analogue-to-digital converter described in our British Patent Specification No. 1,434,414, the analogue input signal to be converted is continuously applied to an integrator, whose output is applied to one input of each of two two-input level detectors. Each level detector compares the output of the integrator with a respective detector level applied to its other input and a periodic signal is superimposed on the output of the integrator. The detector levels are equal in magnitude but opposite in sense to one another, and whenever the signal at one input of either level detector has the same sense as and greater absolute magnitude than the detector level at the other input, the output of that level detector changes from a fist state to a second state. The outputs of the level detectors when in their second states, cause the application of respective reference signals, equal in magnitude but opposite in sense, to the input of the integrator, the reference signal applied by each level detector having the same polarity as the detector level applied to that level detector, and therefore opposite polarity to any integrator input signal which causes a change in state of the output of that level detector. Equilibrium is reached when the mean input to the integrator, due to the analogue signal and the two reference signals, is zero. The period for which one or other of the reference signals has to be applied to achieve this equilibrium is dependent upon the analogue input signal magnitude, and it is possible to measure digitally the duration of this period to provide a digital representation of the magnitude of the signal.

In the converter described in Specification No. 1,434,414, the detector levels are spread apart such that, for zero analogue input signal, the periodic signal (a triangular waveform) superimposed on the integrator output lies wholly or substantially wholly between the levels. Consequently, only one or other of the reference signals is applied to the integrator input for any significant period of time during each cycle of the periodic signal. Although this avoids zero offset problems, it also leads to the disadvantage that any difference in the magnitudes of the reference signals causes a difference in scale factor between measurements of positive and negative input voltages; that is, voltages of equal magnitude and opposite polarity would give measurements having different magnitudes as well as opposite signs. This leads to uncertainty in the use of the measurements, since there is no way of ascertaining which of the two different measurements is in error, so a percentage uncertainty must be assigned to both, even though one may in fact be accurate.

According to another aspect of this invention there is provided a bipolar mark-space analogue-to-digital converter comprising:
integrating means for receiving an analogue input signal to be converted;
means for superimposing a periodic signal on the output signal produced by the integrating means;
first and second level detectors connected to compare the output signal from the integrating means with first and second detector levels respectively, whereby for zero input signal the periodic signal causes the magnitude of the output signal from the integrating means to exceed the first level by crossing it in a direction away from the second level for at least a substantial fraction of one half of each cycle of the periodic signal, and to fall below the second level by crossing it in a direction away from the first level for at least a substantial fraction of the other half of each cycle of the periodic signal, and whereby analogue input signals of one polarity cause the magnitude of the output signal to exceed the first level for more than said fraction of said one half of each cycle, while analogue input signals of the other polarity cause the magnitude of the output signal to fall below the second level for more than said fraction of said other half of each cycle, the first and second level detectors being arranged to produce first and second control signals respectively when the magnitude of the output signal from the integrating means exceeds the first level and falls below the second level respectively;
first and second reference signal sources of opposite polarity;
switch means responsive to the first control signal to apply one of said reference signal sources, opposite in polarity to said one polarity of the analogue input signal to the integrating means, said switch means being also responsive to the second control signal to apply the other of said reference signal sources to the integrating means;
means for defining a conversion interval equal in duration to the duration of an integral number of cycles of said periodic signal;
further switch means for applying said analogue input signal to the integrating means for the duration of one conversion interval and for applying zero input signal to the integrating means for the duration of another conversion interval;
a source of clock pulses; and counter means for counting the clock pulses during the application of either of the reference signal sources to the integrating means, whereby the count in the counter means at the end of the one conversion interval, combined with the count at the end of the other conversion interval, is a digital representation of the magnitude of the integral of the analogue input signal over the one conversion interval, corrected for zero drift.

With this arrangement, zero stability is preserved, but the scale factors for positive and negative input signals remain equal even if one of the reference signal sources changes in magnitude. In addition, the measurement error resulting from such a change is only half that which would occur in similar circumstances with the converter described in the aforementioned British patent specification.

The level detectors may comprise respective transistors, in which circumstances at least one of the detector levels may be defined by the threshold voltage required to initiate conduction through the transistors.

The counter means may comprise a reversible counter, and means for causing the counter initially to count in one direction during the application of the first reference signal source and in the other direction during the application of the second reference signal source.

According to a further aspect of this invention a mark-space analogue-to-digital converter comprises:
generating means for receiving an analogue input signal to be converted to generate a mark-space signal having a mark-space ratio dependent upon the magnitude of the input signal;
means for defining a conversion interval containing a plurality of cycles of said mark-space signal;
a source of clock pulses;
counter means responsive to said mark-space signal to count the clock pulses under the control of each cycle of the mark-space signal to derive a net count dependent upon the mark-space ratio in that cycle; and
a microprocessor arranged to receive the net count of clock pulses counted during each said cycle and to aggregate said counts over the conversion interval, whereby the aggregate count produced by the microprocessor at the end of the conversion interval is a digital representation of the magnitude of the integral of the analogue input signal over the conversion interval.

Microprocessors are known devices, the nature of which will be discussed in more detail hereinafter, but the term 'microprocessor' is intended to describe the combination of a microprocessor unit (operating registers, arithmetic and logic unit and instruction decoder), memory circuitry (read-only memory and random-access memory) and interface circuits for connecting the microprocessor to a system to operate therewith.

Two bipolar mark-space analogue-to-digital converters in accordance with this invention will now be described, by way of example, with reference to the accompanying drawings, in which.

Figure 1:
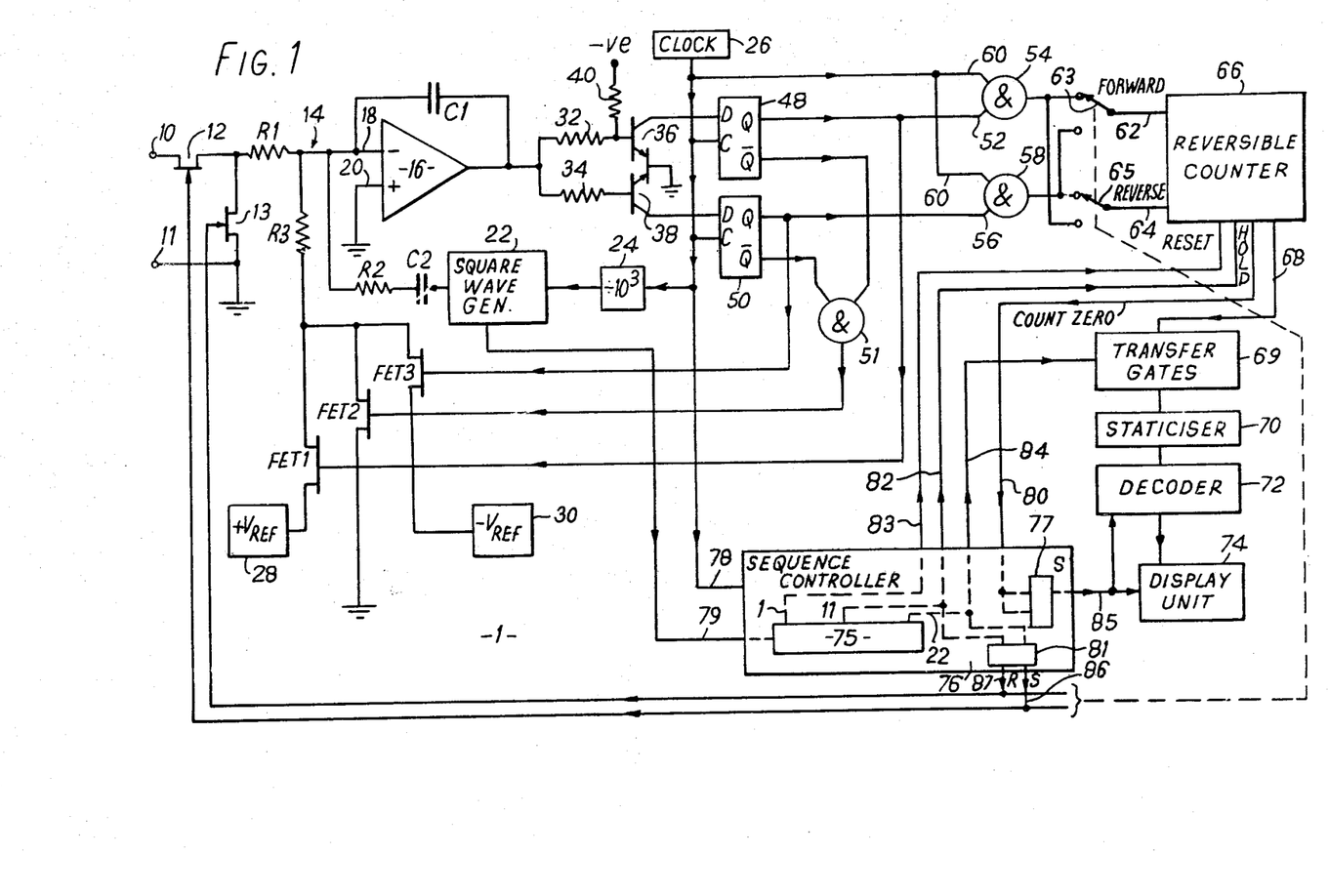
FIG. 1 is a simplified block schematic diagram of the first converter.

The converter shown in FIG. 1 is indicated generally at 1, and comprises a pair of input terminals 10, 11 to which an analogue-input signal to be converted is applied. The input terminal 10 constitutes the input of an integrating amplifier 14, which comprises a high gain differential amplifier 16 having inverting and non-inverting inputs 18, 20 respectively. An FET switch 12 and an input resistor R1 are connected in series between the input terminal 10 and the inverting input 18, and an integrating capacitor C1 is feedback-connected from the output of the amplifier 16 to the inverting input 18. The input terminal 11 and the non-inverting input 20 of the amplifier 16 are both grounded, and another FET switch 13 is connected between the junction of the switch 12 and the resistor R1, and ground.

The inverting input 8 of the amplifier 16 constitutes a summing junction, and the output of a square wave generator 22 is A.C. coupled thereto via the series combination of a capacitor C2 and a resistor R2. The square wave generator produces a square wave output at a typical frequency of 10 kHz, and is connected to be driven via a divide-by-1000 frequency divider 24 by a clock pulse generator 26 having a typical operating frequency of 10 MHz.

Also connected to the inverting input 18 of the amplifier 16 is one end of a resistor R3, whose other end is selectively connectable, via three transistor switches FET1, FET2 and FET3 in parallel, to a positive reference voltage source 28, ground, and a negative reference voltage source 30 respectively. Although the sources 28, 30 are opposite in polarity, their respective magnitudes, $\pm V_{REF}$, are substantially equal: typically they may be +7 volts and −7 volts respectively. Normally, one of the sources 28, 30 comprises a highly stable temperature-controlled zener diode (not shown), and the other is derived therefrom by inversion.

The output of the amplifier 16, which also constitutes the output of the integrating amplifier 14, is connected via respective resistors 32 and 34 to the base electrodes of respective NPN transistors 36 and 38. The emitter electrodes of the transistors 36 and 38 are grounded, and the base electrode of the transistor 36 is coupled to a negative voltage supply (which may conveniently be the source 30) via a resistor 40. The transistors 36 and 38 operate as level detectors, the detector level V1 for the transistor 38 being determined primarily by its base-emitter voltage for conduction, and the detector level V2 for the transistor 36 being rendered slightly higher (by about 200 millivolts) by the resistor 40.

The collector electrodes of the transistors 36 and 38 constitute the outputs of the level detectors and are respectively connected to the respective D inputs of two D-type bistable circuits 48, 50, whose respective clock inputs are both connected to the output of the clock pulse generator 26. The Q output of the bistable circuit 48 is connected to the control input (gate electrode) of the switch FET1, and the Q output of the bistable circuit 50 is connected to the control input of the switch FET3. The $\overline{Q}$ outputs of both bistable circuits 48, 50 are connected to respective inputs of a two-input AND gate 51, whose output is connected to the control input of the switch FET2. Additionally, the Q output of the bistable circuit 48 is connected to one input 52 of a two-input AND gate 54, while the Q output of the bistable circuit 50 is connected to one input 56 of a two-input AND gate 58. The other input 60 of each of the AND gates 54, 58 is connected to the output of the clock pulse generator 26, while the outputs of the AND gates 54, 58 are connected to the forward and reverse count inputs 62, 64 of a reversible multi-decade BCD counter 66, via two respective changeover switches 63 and 65. These switches 63 and 65 (which are shown as mechanical switches for convenience but may be solid-state switches) are arranged such that in a first state the outputs of the AND gates 54 and 58 drive the forward input 62 and the reverse input 64 respectively, as shown, and in the second state these connections are interchanged.

The counter 66 has a count output 68 connected via a set of transfer gates 69 to a staticiser 70. The staticiser 70 in turn is connected via a decoder 72 to a display unit 74, which may be of the known seven-segment light-emitting diode or liquid crystal type.

A sequence controller 76 has three control inputs 78–80 respectively connected to receive control input signals from the clock pulse generator 26, the square wave generator 22, and a detect zero output of the counter 66. The sequence controller 76 comprises a counter 75, which has a typical full house count of twenty-two and which is connected to be driven by the square wave applied to the control input 79 of the sequence controller 76, a first bistable circuit 77 connected to be alternately set and reset by the signal applied to the control input 80 of the sequence controller 76, a second bistable circuit 81 connected to be alternately reset and set by the count eleven and count twenty-two outputs respectively of the counter 75, and further logic circuitry (not shown) such as gates and bistable circuits arranged in a conventional manner. Additionally, the sequence controller 76 has six control outputs 82 to 87, respectively constituted by the count eleven, count one and count twenty-two outputs of the counter 75, the set output of the bistable circuit 77, and the set and reset outputs of the bistable circuit 81, at which control outputs it produces respective control signals, as will hereinafter be described, for application to hold and reset inputs of the counter 66, the transfer gates 69, the decoder 72, and the control inputs (gate electrodes) of the FET switches 12 and 13, respectively. The control output 85 of the sequence controller 76 is also connected to a polarity display input of the display unit 74, while the control output 83 is internally connected to reset the bistable circuit 77. The control outputs 86 and 87 also control the changeover switches 63 and 65, respectively causing them to adopt their first and second states.

Figure 2:
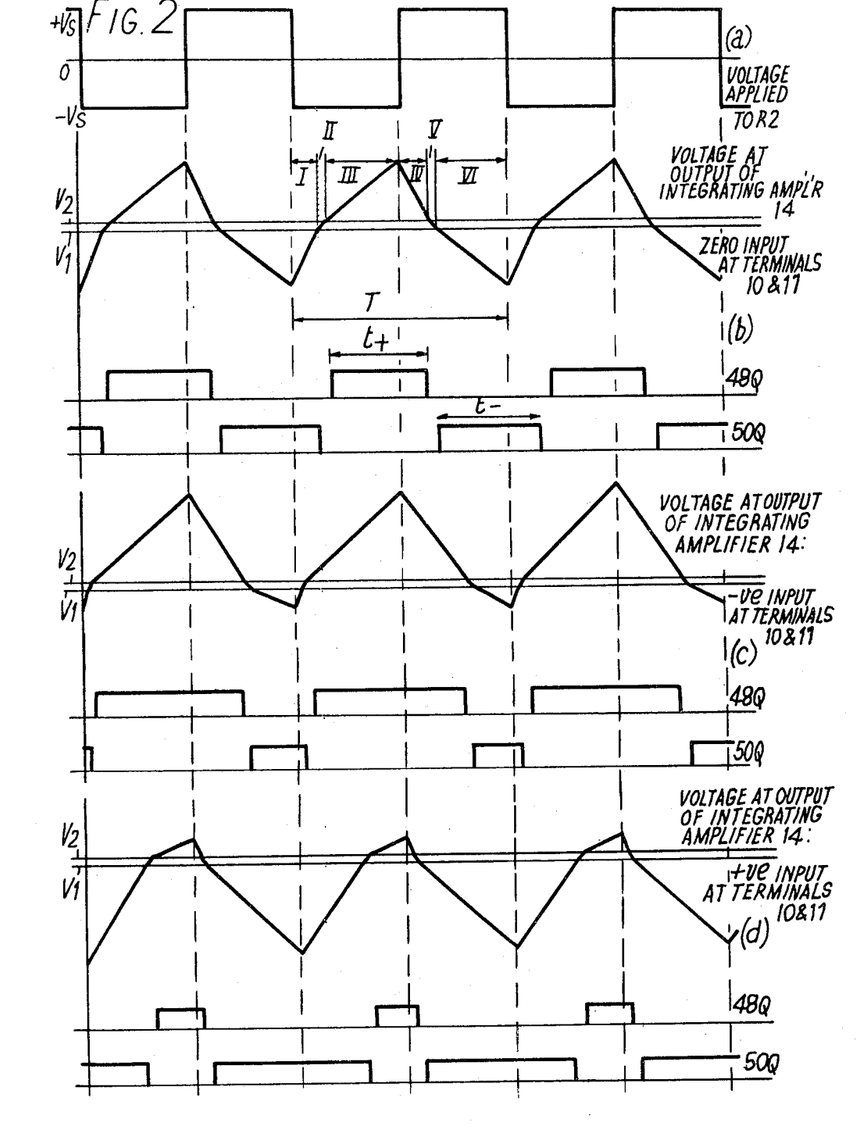
FIGS. 2 and 3 show waveforms occurring at various points in the circuit of FIG. 1.

In operation, and assuming the Q outputs of the bistable circuits 48, 50 are initially in their logic 0 states, the switches FET1 and FET3 are open (non-conducting) and the switch FET2 is held closed (conducting) via the AND gate 51. The square wave produced by the square wave generator 22 is integrated by the integrating amplifier 14. Since the square wave is A.C. coupled to the integrating amplifier 14 via the capacitor C2, its mean D.C. level at the input of the resistor R2 should be zero, and its waveform is as shown in FIG. 2(a). In the absence of an analogue input signal at the input terminals 10, 11, and ignoring the effects of any drift at the input of the amplifier 16, the integrating amplifier 14 therefore produces an output signal of distorted triangular waveform, symmetrically disposed about the voltages V1 and V2, as shown in FIG. 2(b). The separation of the voltages V1 and V2 is relatively small compared to the amplitude of this triangular waveform, so that most of the positive half-cycle of this waveform exceeds the level V2 and most of the negative half-cycle falls below the level V1. Each time the voltage V2 is exceeded, the transistor level detector 36 produces a logic 1 output signal, which is applied to the D input of the bistable circuit 48, so that the first clock pulse to occur after the voltage V2 is crossed in the positive direction sets the Q output of this bistable circuit to its logic 1 state. Similarly, when the output voltage produced by the integrating amplifier 14 falls below the voltage V2 (i.e. during each negative-going flank of the triangular waveform), the output signal produced by the transistor 36 and applied to the D input of the bistable circuit 48 reverts to its logic 0 state, so that the first clock pulse to occur thereafter sets the Q output of the bistable circuit back to its logic 0 state.

The logic 1 state at the Q output of the bistable circuit 48 is effective to close the switch FET1, thus applying the positive reference voltage source 28 to the integrating amplifier 14 in opposition to the input voltage at the terminals 10 and 11. At the same time, the logic 1 state at the Q output of the bistable circuit 48 is also effective to enable the AND gate 54, thereby permitting clock pulses to be applied to, and counted in, the counter 66 throughout the duration of the application of the voltage source 28 to the integrating amplifier 14.

The transistor level detector 38 and the bistable circuit 50 operate in a similar manner to close the switch FET3 and apply the negative reference voltage source 30 to the integrating amplifier 14, whenever the output voltage of the amplifier 14 is below the voltage V1. At the same time, clock pulses are applied via the AND-gate 58 to the counter 66.

Equilibrium is reached, typically after a few cycles of the square wave from the square wave generator 26, when the mean input current (that is, net charge supplied) to the integrating amplifier 14 is zero. Each cycle of the output signal from the integrating amplifier 14 can be divided into six successive periods, indicated by Roman numerals I to VI in FIG. 2(b), during which the charge supplied to the integrating amplifier 14 is as follows:

$$Q_I = \left( -\frac{V_{IN}}{R1} - \frac{V_S}{R2} - \frac{V_{REF}}{R3} \right) t_I$$

$$Q_{II} = \left( -\frac{V_{IN}}{R1} - \frac{V_S}{R2} \right) t_{II}$$

$$Q_{III} = \left( -\frac{V_{IN}}{R1} - \frac{V_S}{R2} + \frac{V_{REF}}{R3} \right) t_{III}$$

$$Q_{IV} = \left( -\frac{V_{IN}}{R1} + \frac{V_S}{R2} + \frac{V_{REF}}{R3} \right) t_{IV}$$

$$Q_V = \left( -\frac{V_{IN}}{R1} + \frac{V_S}{R2} \right) t_V$$

$$Q_{VI} = \left( -\frac{V_{IN}}{R1} + \frac{V_S}{R2} - \frac{V_{REF}}{R3} \right) t_{VI}$$

where $2V_S$ is the peak-to-peak amplitude of the square wave from the square wave generator 26, $V_{IN}$ is a voltage (at present zero) to be applied to the terminals 10 and 11, and $t_I$ to $t_{VI}$ are the durations of the periods I to VI respectively. It can be assumed that the mean value of the charge components due to the square wave is zero, since, nominally, $$t_I + t_{II} + t_{III} = t_{IV} + t_V + t_{VI}$$

If this assumption is incorrect (for example, because the square wave does not have an exact 1:1 mark-space ratio), the effect is a zero error which is automatically compensated by the converter as will be explained hereinafter. The components due to any voltage $V_{IN}$ will be present for the whole period T, where T is the period of the square wave (and equal to the sum of $t_I$ to $t_{VI}$). Thus, at equilibrium and assuming $V_{IN}$ is zero, $$0 = \frac{R_1}{R_3} \cdot V_{REF} \cdot \frac{(t_+ - t_-)}{T} = \text{constant} \times (t_+ - t_-)$$

where $t_+ = t_{III} + t_{IV}$ and $t_- = t_I + t_{VI}$, see FIG. 2(b), and are the durations of the applications of the sources 28 and 30 respectively to the integrating amplifier 14.

It will be noted from FIG. 2(b) that the sources 28 and 30 are each applied for substantially all of a half-cycle of the square wave when there is zero input at the terminals 10 and 11. Also, during the periods I and IV, the sources 28 and 30 augment the square wave, while during the periods III and VI, they oppose it, thus varying the slope of the triangular waveform and distorting it as shown.

When an analogue input signal in the form of a negative input voltage $-V_{IN}$ is applied to the input terminals 10 and 11, and the bistable circuit 81 is set, thereby closing the FET switch 12, the integrating amplifier 14 integrates it to produce a positive component in the triangular waveform output signal produced thereby. This positive component increases the slope of the positive-going flanks of the triangular waveform, and decreases the slope of the negative-going flanks, thus causing the positive peaks to increase in magnitude and duration at the expense of the negative peaks, as shown in FIG. 2(c).

Consequently, the positive reference voltage source 28 is applied for a relatively longer time ($t_+$ increases) and the negative reference voltage source for a relatively shorter time ($t_-$ decreases), in proportion to the magnitude of the input voltage $-V_{IN}$. At equilibrium, $$V_{IN} = \text{constant} \times (t_+ - t_-).$$

Figure 3:
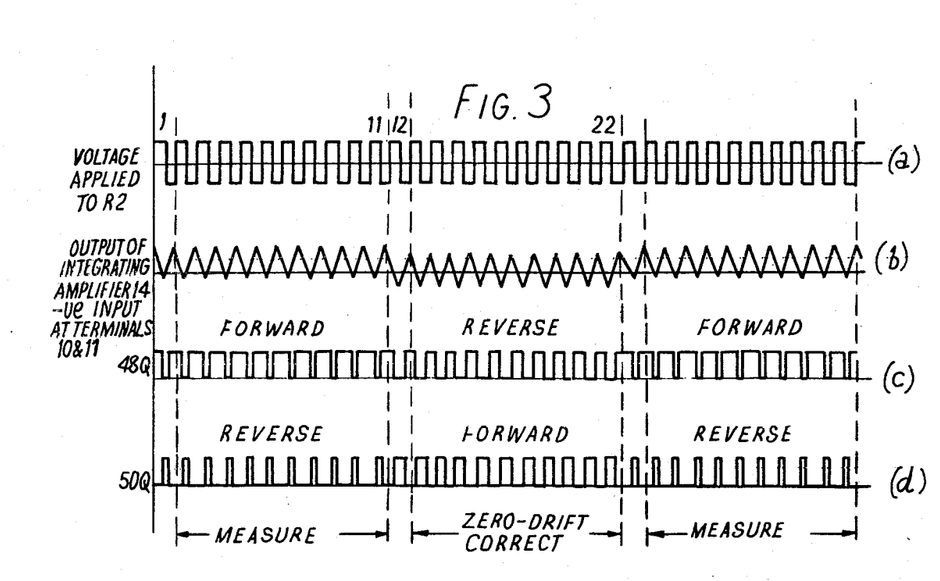

Thus in order to measure the magnitude of the input voltage $-V_{IN}$, the sequence controller 76 produces a start signal at its output 83, which start signal is constituted by a count one output signal from the counter 75 and is therefore co-incident with a predetermined point in a cycle of the square wave from the square wave generator 26. In the embodiment of the invention shown in FIG. 1, this predetermined point is the beginning of a cycle: however this is not essential. This start signal resets the count in the counter 66 to zero, and resets the bistable circuit 77 if necessary. The counter 66 then counts clock pulses from the AND gate 54 in a forward direction throughout the duration of each application of the source 28, and clock pulses from the AND gate 58 in a reverse direction throughout the duration of each application of the source 30, over a first conversion (or measurement) interval whose duration is determined by the counter 75 in the sequence controller 76. The end of the first conversion interval is indicated when the count eleven output of the counter 75 produces an output signal, which appears at the control output 82 of the sequence controller 76. Since this output signal is also co-incident with said predetermined point in, i.e. the beginning of, a cycle of the square wave, the duration of the first conversion interval is equal to an integral number of cycles, ten in the described embodiment, of the square wave (see FIG. 3(a)). This output signal enables the hold input of the counter 66, temporarily preventing it from counting pulses at its inputs 62 and 64, and resets the bistable circuit 81, this circuit 81 having been in its set condition during the first conversion interval. The resetting of the bistable circuit 81 opens the FET switch 12, disconnecting the input voltage $V_{IN}$, and closes the FET switch 13, grounding the input of the integrating amplifier 14. In addition, the switches 63 and 65 are operated so that pulses are supplied by the AND gate 54 to the reverse input 64 of the counter 66, and by the AND gate 58 to the forward input 62—that is, in the opposite sense to that which applied during the first conversion interval.

At the end of the twelfth square-wave pulse, the count eleven output ceases, and the signal on the hold input of the counter 66 disappears. The counter 66 then resumes counting clock pulses for a second conversion interval, until the count twenty-two output is produced by the counter 66, that is, for another ten pulses of the square wave (see FIG. 3(a)). During this second conversion interval, the counter 66 counts clock pulses from the AND gate 58 in the forward direction throughout the duration of each application of the source 30, and clock pulses from the AND gate 54 in the reverse direction throughout the duration of each application of the source 28, these sources being applied in accordance with the zero input voltage to the integrating amplifier 14 resulting from the grounding of the input via the FET switch 13.

Nominally, the sources 28 and 30 should be applied for equal periods during the second conversion interval (see FIGS. 3(c) and 3(d)), but, in practice, this may not be so, owing to, for example, amplifier drift or departures from 1:1 in the mark-space ratio of the square wave. Accordingly, at the end of the second conversion interval, there may be a small net count of clock pulses representative of the magnitude and sign of any such zero drift. However, this small net count will have been accumulated in the counter 66 in the reverse sense to the counting which took place during the first conversion interval, by virtue of the changeover of the switches 63 and 65 at the end of the first conversion interval. Thus, at the end of the second conversion interval, the counter 66 contains a number representative of the magnitude of the input signal $V_{IN}$, but corrected for any zero drift that exists.

For a negative input signal $V_{IN}$, for example, the net count at the end of the first conversion interval will be positive, since the source 28 will have been applied for a longer aggregate time than the source 30 (see FIGS. 2(c) and 3). If there is a small negative zero drift, for example, the source 28 will again be applied for longer than the source 30, resulting in another net surplus of clock pulses from the AND-gate 54. However, these pulses are counted by the counter 66 via the switch 65 and the reverse input 64. Thus these pulses are deducted from those accumulated in the counter 66 during the first conversion interval, thereby reducing the net count and compensating for the aggregation of the negative input signal with the negative zero drift which occurs during the first conversion interval.

The count twenty-two signal which defines the end of the second conversion interval enables the transfer gates 69, and is therefore effective to strobe the final count in the counter 66 into the staticiser 70. This signal also sets the bistable circuit 81 again, thereby opening the FET switch 13 and closing the FET switch 12, and setting the switches 63 and 65 back to the positions shown in FIG. 1, in preparation for another conversion interval for measuring the input voltage $V_{IN}$.

During the operations described above, the sequence controller 76 receives no signal from the detect zero output of the counter 66, since this detect zero output is adapted to produce an output signal, when the count in the counter 66 either goes from all zeroes to all nines in the reverse count direction or from all nines to all zeros in the forward count direction, and this does not occur with a negative input signal $V_{IN}$. The bistable circuit 77 in the sequence controller 76 therefore remains in its reset state, which is arranged to set the decoder 72 to operate as a BCD-to-seven-segment decimal decoder. The decoder 72 thus decodes the count held in the staticiser 70, and the decoded count is displayed by the display unit 74 as the required zero-drift-corrected measurement. The signal at control output 85 of the sequence controller 76 additionally causes the display unit 74 to display a negative polarity indication.

The next count one output signal from the counter 75 in the sequence controller 76 constitutes a further start signal, which causes the whole measurement cycle described above (comprising two conversion intervals) to be repeated. However, the display unit 74 continues to display the decoded value of the count held in the staticiser 70 until the end of the second conversion interval, when the new value of the count in the counter 66 is strobed into the staticiser.

When an analogue input signal in the form of a positive input voltage $+V_{IN}$ is applied to the input terminal 10, a negative component is introduced into the triangular waveform output signal produced by the integrating amplifier 14. This negative component increases the slope of the negative-going flanks of the triangular waveform output signal, and decreases the slope of the positive-going flanks, thus causing the negative peaks of the triangular waveform output signal to increase in magnitude and duration at the expense of the positive peaks, as shown in FIG. 2(d). In a manner complementary to that already described with reference to negative analogue input voltages, the negative reference voltage source 30 is applied to the integrating amplifier 14 more often than is the positive source 28, in opposition to the positive input voltage at the terminals 10 and 11. Consequently, more clock pulses are supplied via the AND gate 58 to the reverse input 64 of the counter 66 than are supplied via the AND gate 54 to the forward input 62, and there is a net negative count.

Equilibrium is reached, as already described, when the mean input current to the integrating amplifier 14 is zero, and the measurement and the zero-drift correction are performed during two successive conversion intervals, also as already described. However, this time the final count in the counter 66 is in nines complement form. But when the count in the counter 66 goes from all zeroes to all nines, the sequence controller 76 receives a signal from the detect zero output of the counter. This signal sets the bistable circuit 77 in the sequence controller 76, which in turn sets the decoder 72 to operate as a nines-complement-BCD to seven-segment decimal decoder. This can be accomplished, for example, merely by complementing the signal at the input of the decoder 72 by means of switching circuitry, before its application to the main decoding circuitry. The correctly decoded output from the decoder is then displayed by the display unit 74, which additionally displays a positive polarity indication in response to the set signal from the bistable circuit 77, which appears at the control output 85 of the sequence controller 76.

Performing the measurement before the zero-drift correction, as described above, permits a measurement to be executed at a precisely defined point in time. Known converters have to test for zero-drift before a measurement is made, thereby introducing uncertainty into the time at which the measurement actually occurs. The converter of this invention can also provide advantages when used in, for example, a data logger for successively sampling and recording the values of a number of parameters represented by respective analogue signals. The logger would include a selector or scanner which selects each analogue signal in turn for application to the converter. After the scanner has switched to a new signal it is necessary to delay the measurement of that signal to allow switching transients to settle. With the converter described above, this switching can take place at the start of the second conversion interval, when the FET switch 12 is open and the zero-drift check is taking place. The second conversion interval thus provides the desired settling time, so that the measurement of the new signal can take place without delay at the start of the following first conversion interval. Furthermore, by only checking zero-drift immediately after each measurement, it is possible to monitor an input signal effectively continuously, without risk of interruption by an independently-triggered regular drift-correct cycle.

The reason for employing a reversible counter as the counter 66 is as follows. Consider the case of a very small input voltage having a noise signal superimposed thereon. This noise signal may cause occasional reversal of the polarity of the input voltage during the conversion interval, so that the triangular waveform output signal produced by the integrating amplifier effectively moves up and down with respect to the voltages V1 and V2 and successively trips the level detector 36 longer than the level detector 38 and vice versa. Each time the level detector 36 is tripped, the counter 66 counts forwardly, each time the level detector 38 is tripped, the counter 66 counts in reverse, and each time the count in the counter 66 goes from all zeroes to all nines or vice versa, a signal is produced at its detect zero output. The signals at the detect zero output of the counter 66 alternately set and reset the bistable circuit 77 in the sequence controller 76, so the state of the bistable circuit 77 indicates whether the net count in the counter 66 at any instant during the conversion interval is above zero, and therefore representative of an analogue input voltage having a mean negative value up to that instant, or below zero, and therefore representative of an analogue input voltage having a mean positive value up to that instant. It will be appreciated that the state of the bistable circuit 77 at the end of the conversion interval provides the signal at the control output 85 of the sequence controller 76.

It can be shown that, in general, the duration of the period $(t_+ - t_-)$ is proportional to the integral of the input voltage $V_{IN}$ over any integral number of periods T of the square wave. It will be appreciated that the magnitude of the input current to the integrating amplifier 14 due to $V_S$ should be larger than twice that of the respective currents due to full scale positive and negative input voltages, since each reference source 28 and 30 is equal in magnitude to the full-scale voltage and may be applied simultaneously.

If desired, the output of the square wave generator 22 can be phase-locked to a line-frequency signal, typically at 50 or 60 Hz. The duration of the conversion interval can then be made very closely equal to the duration of an integral number of cycles e.g. one, of the line-frequency signal, so as to provide excellent rejection of any series mode interference at the line frequency which may be superimposed on the input voltage.

Figure 4:
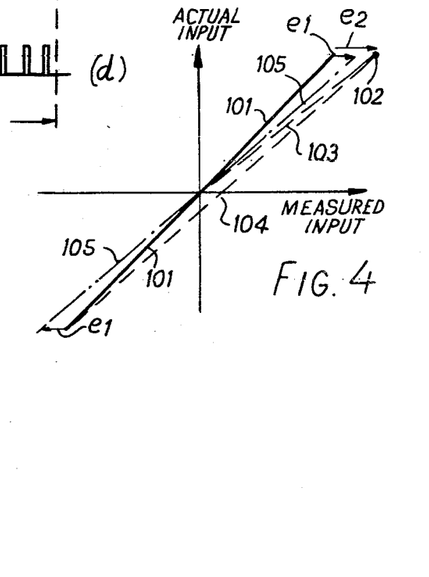
FIG. 4 is a scale factor graph illustrating a feature of the operation of the converter.

The operation of the converter to alleviate differences in positive and negative scale factors is illustrated in FIG. 4.

Referring to FIG. 4, the solid line 101 illustrates the optimum measurement characteristic, with true zero and equal positive and negative scale factors. If, for example, the negative reference voltage source 30 decreases slightly in value, the extreme positive point if the characteristic in the upper right-hand quadrant can be considered as moving to the right, to the position 102, while the extreme negative point in the lower left-hand quadrant remains fixed. With the circuit described in the aforementioned Patent Specification No. 1 434 414, the measurement characteristic would become non-linear, as shown by the long-dash line 103, because of the use of separately-applied reference voltage sources. However, with the converter of FIG. 1, the characteristic can 'move sideways' on the graph, to remain a straight line joining the extreme positive and negative points—the short-dash line 104 in FIG. 4. The zero-drift correction procedure described earlier then operates to compensate the resulting zero error, effectively shifting the characteristic sideways to the position shown by the chain-line 105. It can be seen from FIG. 4 that the resulting positive error $e_1$ is only half what it would be $(e_2)$ if the characteristic 103 were operative. At the same time, an equal error $e_1$ has been added to the negative part of the characteristic. However, with the characteristic 101/103, there is no way of distinguishing from the measurement alone which polarity is in error. Therefore, it would be necessary to treat the characteristic 101/103 as if it had an error of $e_2$ for both polarities. In contrast, with the converter of FIG. 1 (characteristic 105), each polarity has an error of only $e_1$, half the value of $e_2$. In addition, zero stability is retained, and the converter always has equal positive and negative scale factors.

The need for circuitry described in relation to FIGS. 4 and 5 of Specification No. 1 434 414, for ensuring that each reference voltage source is applied for a short time in every cycle of the square wave whatever the value of the analogue input signal, is eliminated with the converter of FIG. 1, since both sources are applied in every cycle as an inherent part of the operation of the circuit. In addition, the time taken for the switches FET1 and FET3 to switch on and off, as a proportion of the periods for which the sources 28 and 30 are applied, is largest at full scale reading, when one of these periods is at a minimum. Thus any errors attributable to this switching time have their greatest effect at full scale reading, when they are relatively insignificant, whereas with the earlier converter of Specification No. 1 434 414, these errors have their greatest effect at zero scale reading, when they could be much more noticeable.

In addition to eliminating the need for the circuitry described with reference to FIGS. 4 and 5 of Specification No. 1 434 414, it has been found that the converter of FIG. 1 permits a considerable simplification and saving in cost in its associated circuitry when incorporated in, for example, a digital voltmeter. Thus, the input amplifiers and gain selectors of a voltmeter incorporating a converter as shown in FIG. 1 can be made with ordinary, general-purpose operational amplifiers and field-effect transistors, instead of special low-drift and low-leakage types.

Instead of using the sequence controller 76 to control the operation of the converter 1, as in FIG. 1, it is possible to program a microprocessor to operate the various other parts of the converter 1 in the correct sequence described above. In addition, the microprocessor can be programmed to perform a variety of calculations on the measurements obtained with the converter 1.

For convenience, the construction and operation of a typical microprocessor will be discussed first. Microprocessors are well known, and therefore only a brief outline need be given here.

Figure 5:
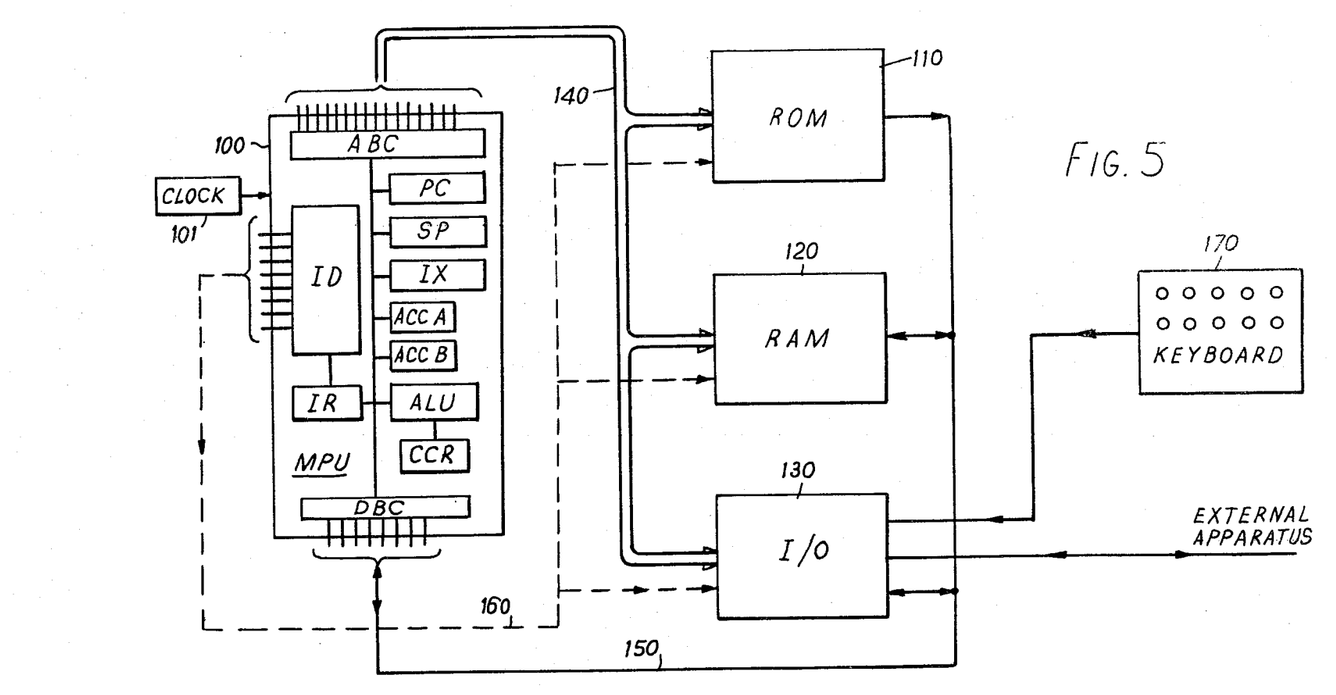
FIG. 5 is a block schematic diagram of a typical microprocessor.

Referring to FIG. 5, a microprocessor typically has four main parts: a microprocessor unit (MPU) 100, a read-only memory (ROM) 110, a random-access memory (RAM) 120 and an input-output unit 130. The microprocessor unit 100 itself includes a series of operations registers PC, SP, IX; two accumulators ACC A and ACC B; an arithmetic and logic unit ALU and associated condition code register CCR; an instruction register IR and instruction decoder ID; and address output buffer circuits ABC and data buffer circuits DBC. The four parts 100, 110, 120 and 130 are interconnected by three groups of conductors: a 16-line address bus 140, an 8-line data bus 150 and a control line 160.

Part of the design and assembly of the microprocessor involves writing, and storing in the ROM 110, a sequence or program of coded instructions which govern the operation of the microprocessor. These coded instructions (such as 'load a number into an accumulator', 'add', 'shift one place left' and 'complement all binary digits in a number') are stored in individual numbered locations in the ROM 110. When the number (comprising 16 binary digits) of one of these locations is presented by the MPU 100 on the address bus 140, the instruction (comprising 8 binary digits) stored in that location is provided by the ROM 110 on the data bus 150. The instruction thus extracted is effectively copied, and remains unchanged in the ROM 110—the name 'read-only memory' indicates that its contents can only be read out, and cannot be altered by the MPU 100, for example by writing in new information.

In operation, the number of a location (for example, 1005) in the ROM 110 is held in the register PC and applied to the address bus 140, with the result that the instruction in that location 1005 is supplied via the data bus 150 to the instruction register IR. At the same time, the register PC is automatically incremented by one to 1006. The instruction decoder ID decodes the instruction, and causes the accumulators ACC A and ACC B and the arithmetic and logic unit ALU for example, to carry out the instruction. This may involve mathematical manipulation of data, this data being stored in the RAM 120. The RAM 120 differs from the ROM 110 only in that information can be both read out of it and written into it, this latter process involving the obliteration of any data already in a numbered location into which new data is written.

If, for example, the instruction in the instruction register IR were 'add the data in RAM location x to the contents of accumulator ACC A', the instruction decoder ID would, in general terms: cause the contents of the register PC (1006) to be applied to the address bus 140, to extract the first half of the address x previously stored at location 1006 in the ROM 110 when the program was loaded into it; repeat the operation with the incremented contents of the register PC (1007) to extract the second half of the address x; apply the address thus built up in the circuits ABC to the address bus 140; send a trigger (read) signal on the control line 160 to the RAM 120 so it responds by supplying the data in location x to the data bus 150; and trigger the arithmetic and logic unit ALU to perform an addition operation between the data on the data bus 150 and data previously loaded into the accumulator ACC A. The condition code register CCR co-operates with the unit ALU in this, and the registers SP, IX are involved in other methods of storing information in and extracting information from the memories 110 and 120. These techniques are well known in the art.

The data in the location x in the RAM 120 may be the result of a previous operation of the MPU 100. Alternatively, it may have been supplied to the RAM 120 via the input-output circuit 130, from apparatus which the microprocessor is controlling, or, particularly, from a keyboard 170 by means of which data and instructions can be entered into the microprocessor manually. Again, the techniques for achieving this are well known and need not be discussed here.

The sequential operation of the various parts of the microprocessor as described above is triggered in conventional manner by timing pulses supplied by a clock 101 to the MPU 100.

Figure 6:
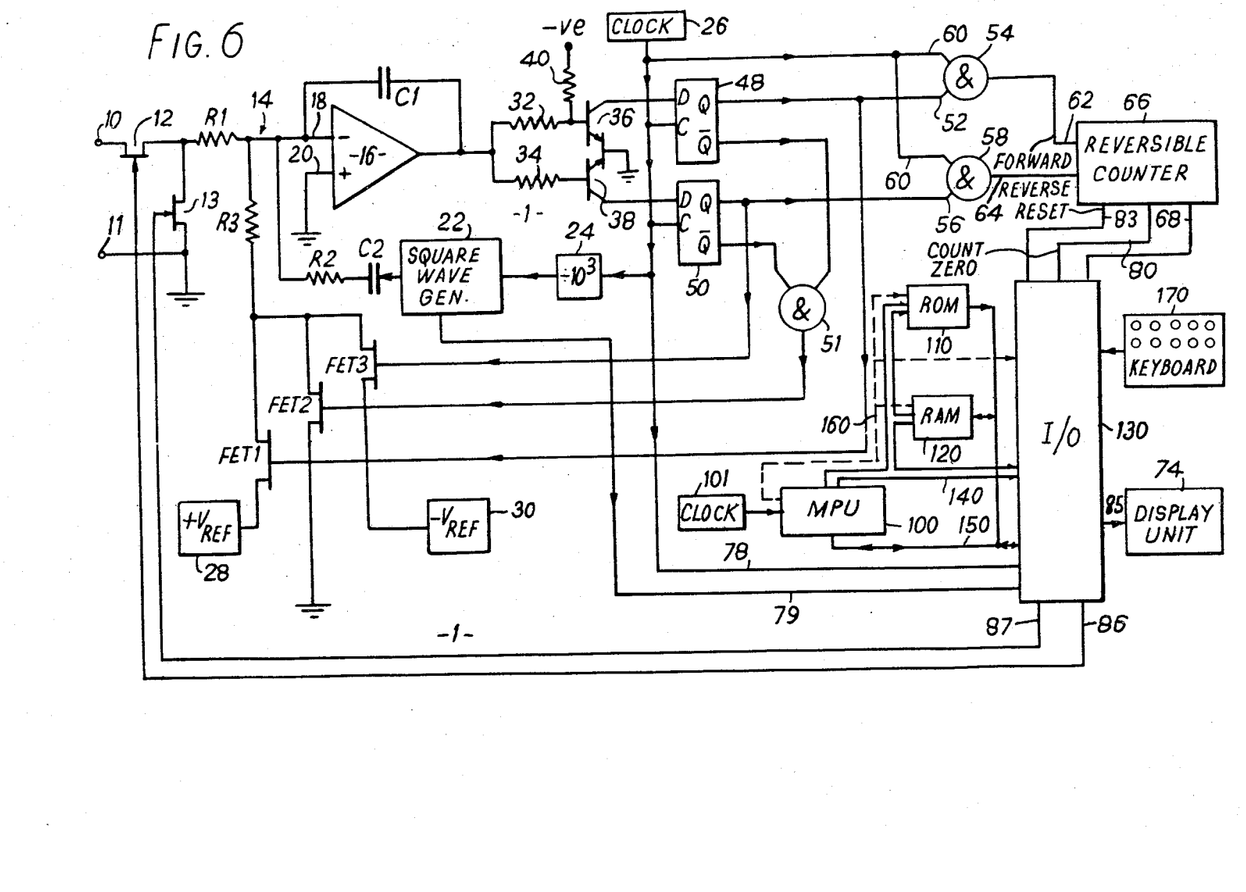
FIG. 6 is a simplified block schematic diagram of the second converter, incorporating the microprocessor of FIG. 5.

Referring now to FIG. 6, there is shown a digital voltmeter including the analogue-to-digital converter of FIG. 1, with the sequence controller 76, transfer gates 69, staticiser 70 and decoder 72, replaced by the microprocessor of FIG. 5 arranged to supervise logic functions in the converter and the voltmeter as a whole.

The converter in FIG. 6 is arranged in a generally similar manner to that shown in FIG. 1, and like parts in the two drawings have like reference numerals. However, the following differences should be noted. The outputs of the AND gates 54, 58 are respectively connected directly to the forward and reverse count inputs 62, 64 of the reversible multi-decade BCD counter 66, rather than through the changeover switches 63 and 65 shown in FIG. 1.

The count output 68 of the counter 66 constitutes one input of the input-output circuit 130 of the microprocessor (comprising the MPU 100, ROM 110, RAM 120, circuit 130, busses 140 and 150 and line 160 as described with reference to FIG. 5). One output of the circuit 130 is connected to the display unit 74.

The circuit 130 has three other control inputs 78–80 respectively connected to receive control input signals from the clock pulse generator 26 (which may be combined with the clock 101 in the microprocessor), the square wave generator 22, and the detect zero output of the counter 66 (the hold input of which is not used in this embodiment). In addition, the circuit 130 has three other control outputs 83, 86 and 87, at which it produces respective control signals under the control of the MPU 100, as will hereinafter be described, for application to the reset input of the counter 66 and the control inputs (gate electrodes) of the FET switches 12 and 13, respectively.

To commence a measurement, the circuit 130 closes the FET switch 12, thereby applying the analogue input signal (for example a negative voltage $-V_{IN}$) at the input terminals 10 and 11 to the integrating amplifier 14 via the resistor R1. The circuitry operates as previously described with reference to FIGS. 1 and 2 to apply the positive reference voltage source 28 via the resistor R3 for a relatively longer time and the negative reference voltage source 30 for a relatively shorter time, in proportion to the magnitude of the input voltage $-V_{IN}$.

Thus, in order to measure the magnitude of the input voltage $-V_{IN}$, the MPU 100, under the control of the program of instructions previously stored in the ROM 110, produces a start signal at the output 83 of the circuit 130, which start signal coincides with a predetermined point in a cycle of the square wave from the generator 26. As in the embodiment shown in FIG. 1, this predetermined point is the beginning of a cycle; however, this is not essential. This start signal resets the count in the counter 66 to zero, and the counter 66 then counts clock pulses from the AND gate 54 in a forward direction throughout the duration of each application of the source 28, and clock pulses from the AND gate 58 in a reverse direction throughout the duration of each application of the source 30. The program controlling the microprocessor is arranged so that, at the end of each pulse of the square wave from the generator 26, the microprocessor extracts the net count from the counter 66 on the count output 68 and maintains an aggregate of these counts. After each such extraction the counter 66 is reset to zero again, via the control output 83, ready to count the clock pulses driving the next application of each of the sources 28 and 30. Thus the full-house count of the counter 66 need only be large enough to accommodate the number of clock pulses which can occur during the longest possible single application of either of the sources 28 and 30.

Under the control of its program, the microprocessor continues aggregating the counts from the counter 66 for a total of ten cycles from the square wave generator 26, this period defining a first conversion interval (see FIG. 3(a)). At the end of the first conversion interval (that is, when the microprocessor has counted ten cycles of the square wave) the microprocessor opens the FET switch 12, disconnecting the input voltage $V_{IN}$, and closes the FET switch 13, grounding the input of the integrating amplifier 14. The microprocessor also resets the counter 66 after one square wave cycle, to allow switching transients to settle, and then resumes aggregation of counts from the counter 66 for a second conversion interval of ten square wave cycles (see FIG. 3(a)). These counts are produced in dependence upon the application of the sources 28 and 30, these sources being in turn applied in accordance with the zero input voltage to the integrating amplifier 14 resulting from the grounding of the input via the FET switch 13. Accordingly, the microprocessor program causes these counts to be subtractively aggregated with the total count carried forward from the first conversion interval. Thus, if there is any zero drift in the converter, owing to, for example, amplifier drift or departures from 1:1 in the mark-space ratio of the square wave, the corresponding small net count in the second conversion interval will be algebraically subtracted from the net count for the first conversion interval. At the end of the second conversion interval therefore, the microprocessor will have stored in the RAM 120 a number representative of the magnitude of the input signal $V_{IN}$, but corrected for any zero drift that exists.

For a negative input signal $V_{IN}$, for example, the net count at the end of the first conversion interval will be positive, since the source 28 will have been applied for a longer aggregate time than the source 30 (see FIGS. 2(c) and 3). If there is a small negative zero drift, for example, the source 28 will again be applied for longer than the source 30, resulting in another net surplus of clock pulses from the AND-gate 54.

However, these pulses are aggregated subtractively by the microprocessor, thereby reducing the net count and compensating for the aggregation of the negative input signal with the negative zero drift which occurs during the first conversion interval.

After the second conversion interval, that is, when the microprocessor has again counted ten square-wave cycles, the final net count stored in the RAM 120 is compared, digit by digit, with a look-up table in the ROM 110 which contains all the possible digits and the corresponding patterns of energisation required for a seven-segment display to define those digits. The patterns required for each digit in the final count are temporarily stored, and then supplied one by one in a multiplex mode of operation to the display unit 74 along the output 85. Thus, the circuit 130 periodically 'interrupts' the MPU 100 and requests the appropriate pattern for one digit position of the display. This pattern is supplied by the RAM 120 to the circuit 130, which energises the anodes (bars) of all the digit positions in the display in accordance with the pattern, and also energises the common, cathode electrode of only that digit position which is required to display the digit defined by that pattern. Subsequently, the process is repeated for each digit position in turn, at a rate fast enough to avoid flickering of the image presented by the display.

At the same time, the microprocessor opens the FET switch 13 and closes the FET switch 12, and resets the counter 66 again, in preparation for another conversion interval for measuring the input voltage $V_{IN}$.

During the operations described above, the microprocessor receives no signal from the detect zero output of the counter 66, since this output is adapted to produce an output signal when the count in the counter 66 either goes from all zeroes to all nines in the reverse count direction or from all nines to all zeroes in the forward count direction, and this does not occur with a negative input signal $V_{IN}$. Thus the final net count will be in ordinary BCD form, and is decoded directly via the look-up tabel in the ROM 110 to provide a display of the required zero-drift-corrected measurement. The control output 85 is then also caused by the microprocessor to supply a signal to the display unit 74 effecting the display of a negative polarity indication. While the measurement cycle described above, comprising two conversion intervals, is being repeated, the microprocessor continues to supply the display unit 74 with the digit patterns necessary for the decoded count to be displayed, until a new final count is aggregated in the microprocessor.

When an analogue input signal in the form of a positive input voltage $+V_{IN}$ is applied to the input terminal 10, the negative reference voltage source 30 is applied to the integrating amplifier 14 more often than is the positive reference voltage source 28, as previously described. Consequently there is a net negative count aggregated by the microprocessor, and this count is in nines complement form—the detect zero output of the conductor 66, generated when the count in the counter 66 goes from all zeroes to all nines, indicates to the microprocessor that the count is negative. Accordingly, the microprocessor is arranged to complement the nines-complement BCD count before comparison with the look-up table in the ROM 110, and supply a signal on the output 85 to cause a positive polarity indication to be provided by the display unit 74 alongside the correctly-decoded final count.

It will be understood that the program of instructions for the microprocessor, stored in the ROM 110, provides for the various sequences of logical steps in the MPU 100 which are necessary to effect the various operations of the microprocessor described above. These logical steps would include, for example, repeatedly adding to and storing the accumulating count of clock pulses, comparing the number of square wave cycles counted with, for example, ten to determine the end of a conversion interval, comparing each digit of the final count with the look-up table in the ROM 110, supplying control signals to the input-output circuit 130 to control the FET switches 12 and 13 and the display unit 74, and adjusting the period of the conversion interval to vary the range of the measurements in accordance with manual commands entered via the keyboard 170.

In addition, the ROM 110 contains a number of routines which may be called into operation manually by commands entered via the keyboard 170. These routines cause the microprocessor to undertake calculations upon the measurements produced by the converter 1, in order to derive the values of various functions involving those measurements. The routines comprise sequences of instructions corresponding to formulae and equations defining the functions required. Thus, for example, an averaging routine would keep a running total of a series of measurements, and also count the number of measurements in the series, and then divide the total by that number to provide the desired average. This routine would in turn involve instructions for repeated extraction and incrementing of the total and the number stored in the RAM 120 as each new measurement is performed, and a division operation whenever an average is required.

Routines which can be provided are as follows:

(a) calculation of the ratio $V/r$ of a measurement V and a reference value r (which could be another measurement);

(b) calculation of the logarithm of the ratio $$20(\log_{10} V/r) \quad \text{(in decibels)};$$

(c) calculation of the power $V^2/R$ dissipated by a measured voltage V applied across a specified resistance R;

(d) comparison of a measurement V with two threshold values $T_1$ and $T_2$—counts number of measurements V respectively above, between, and below $T_1$ and $T_2$;

(e) calculation of the average $(V_1+V_2+\ldots V_n)/n$ of a number n of measurements V;

(f) calculation of the area (time integral) $V_1 \cdot \delta t_1 + V_2 \delta t_2 + V_3 \delta t_3 + \ldots V_n \cdot \delta t_n$ of a number n of measurements V;

(g) calculation of the variance $\sigma^2 = [(V_1-m)^2 + (V_2-m)^2 + \ldots (V_n-m)^2]$ of a number n of measurements V having a mean value m;

(h) calculation of the standard deviation $\sigma$ (see g) of a number n of measurements V having a mean value m;

(i) calculation of the root-mean-square value $(V_1^2 + V_2^2 + \ldots V_n^2)^{\frac{1}{2}}/n$ of a number n of measurements V;

(k) tracking time t elapsed since the start of a series of measurements;

(l) calculation of the average (see e) of a number n of measurements V having values between two threshold values $T_1$ and $T_2$ (see d);

(m) calculation of the area (time integral—see f) of a number n of measurements V having values between two threshold values $T_1$ and $T_2$ (see d); and (n) conversion of a measurement V according to a specified function, e.g. a polynomial $$T = aV^3 + bV^2 + cV + d$$

for example for linearisation of a thermocouple output signal.

These functions are conveniently accorded a respective code number, so that each may be called into operation by pressing a first key on the keyboard 170 for programmed functions, and then the appropriate key carrying the code number of the desired function. The program of instructions in the ROM 110 is then inspected by the microprocessor for the segment of instructions relating to that function, and the segment implemented by the microprocessor: the microprocessor continues to implement the instructions for control of the a-d conversion process, the display of results, etc., on a time-sharing basis with this segment of instructions. The segment will cause the display to request any preliminary information required, such as the limits $T_1$ and $T_2$ in (d), and then proceed to control the calculation and display of the value of the desired function.

Many modifications can be made to the described embodiment of the invention. Thus, instead of connecting the square wave generator 22 to the input of the integrating amplifier 14, a summing circuit may be connected to receive the output of the integrating amplifier 14 and arranged to sum this output with a triangular waveform signal from a suitable waveform generator, the output of the summing circuit being applied to the level detectors 36, 38. Further, the switch FET2 may be omitted if desired, in view of the fact that the input 20 of the amplifier 16 is grounded. It will be understood that the expression "grounded" in this specification merely means connected to a signal low line, or zero volt line, since it is possible for the main circuitry of the converter 1 to be fully floating. Since the conversion interval may be made as long as desired, the counter 66 may be arranged to operate in the floating point mode.

The converter may also be modified as described with reference to FIG. 3 of Specification No. 1 434 414, to eliminate the need for a decoder capable of decoding nines-complement BCD to seven-segment format.

The invention has been described with first (measurement) and second (zero-drift correction) conversion intervals occurring in that order, since this arrangement permits a measurement to be started accurately at any desired instant. However, the order of these conversion intervals may be reversed, if desired. Furthermore the first and second conversion intervals need not alternate; a conversion interval for zero-drift correction could take place at regular intervals, for example every ten seconds, with the result being stored for correction of all the measurements which are made until another check of zero-drift takes place.

In the embodiment shown in FIG. 6, the counter 66 may be a binary counter instead of a BCD counter, the aggregation of counts by the microprocessor then being carried out in pure binary arithmetic. In this case, the microprocessor would be programmed to convert the final count from binary to decimal for operation of the display 74.

The invention is not restricted to use in the type of mark-space converter shown in FIGS. 1 and 6, but is also applicable to the converter of Specification No. 1 434 414, and to dual-slope converters, for example.

I claim:

1. A bipolar mark-space analogue-to-digital converter having balanced scale factors for positive and negative applied voltages comprising:

integrating means for receiving an analog input signal to be converted;

means for superimposing a periodic signal on the output signal produced by the integrating means;

first and second reference signal sources of opposite polarity;

first and second level detectors connected to compare the output signal from the integrating means with first and second detector levels respectively, wherein, to balance scale factors substantially independently of drift or imbalance in said reference signal sources, for zero input signal, the periodic signal causes the magnitude of the output signal from the integrating means to exceed the first level by crossing it in a direction away from the second level for at least a substantial fraction of one half of each cycle of the periodic signal, and to fall below the second level by crossing it in a direction away from the first level for at least a substantial fraction of the other half of each cycle of the periodic signal, and wherein analogue input signals of one polarity cause the magnitude of the output signal to exceed the first level for more than said fraction of said one half of each cycle, while analogue input signals of the other polarity cause the magnitude of the output signal to fall below the second level for more than said fraction of said other half of each cycle, the first and second level detectors being arranged to produce first and second control signals respectively when the magnitude of the output signal from the integrating means exceeds the first level and falls below the second level respectively;

switch means responsive to the first control signal to apply one of said reference signal sources, opposite in polarity to said one polarity of the analogue input signal to the integrating means, said switch means being also responsive to the second control signal to apply the other of said reference signal sources to the integrating means;

means for defining a conversion interval equal in duration to the duration of an integral number of cycles of said periodic signal;

further switch means for applying said analogue input signal to the integrating means for the duration of one conversion interval and for applying zero input signal to the integrating means for the duration of another conversion interval;

a source of clock pulses; and counter means responsive to the first and second control signals for counting the clock pulses during the application of either of the reference signal sources to the integrating means, whereby the count in the counter means at the end of the one conversion interval, combined with the count at the end of the other conversion interval, is a digital representation of the magnitude of the integral of the analogue input signal over the one conversion interval, corrected for zero drift.

2. A converter according to claim 1, wherein the level detectors comprise respective transistors.

3. A converter according to claim 1 wherein the counter means comprises a reversible counter, and means for causing the counter initially to count in one direction during the application of the first reference signal source and in the other direction during the application of the second reference signal source.

4. A converter according to claim 2, wherein at least one of the detector levels is defined by the threshold voltage required to initiate conduction through the transistors.

* * * * *